United States Patent [19]
Pascucci et al.

[11] Patent Number: 5,841,728
[45] Date of Patent: Nov. 24, 1998

[54] HIERARCHIC MEMORY DEVICE HAVING AUXILIARY LINES CONNECTED TO WORD LINES

[75] Inventors: Luigi Pascucci, Sesto S. Giovanni; Paolo Rolandi, Volpedo; Marco Fontana, Milan; Antonio Barcella, Trescore Balneario, all of Italy

[73] Assignee: SGS-Thomson Microelectronics, S.r.l., Italy

[21] Appl. No.: 724,495

[22] Filed: Sep. 30, 1996

[30] Foreign Application Priority Data

Sep. 29, 1995 [EP] European Pat. Off. .............. 95830405

[51] Int. Cl.⁶ ...................................................... G11C 8/00
[52] U.S. Cl. .................................. 365/230.06; 365/230.03
[58] Field of Search ........................... 365/230.06, 230.03

[56] References Cited

U.S. PATENT DOCUMENTS

| | | | |
|---|---|---|---|
| 4,344,005 | 8/1982 | Stewart | 307/463 |
| 4,658,377 | 4/1987 | McElroy | 365/149 |
| 4,701,885 | 10/1987 | McElroy | 365/189 |
| 4,800,525 | 1/1989 | Shah et al. | 365/72 |
| 5,589,699 | 12/1996 | Araki | 365/185.17 |
| 5,596,542 | 1/1997 | Sugibayashi et al. | 365/230.06 |
| 5,635,748 | 6/1997 | Nishizaka | 365/104 |

OTHER PUBLICATIONS

Yasuhiro Hotta et al, "A 26NS 1MBit CMOS Mask ROM," IEICE Transactions, vol. E74, No. 4, 1 Apr. 1991, pp. 890–895, XP 000241311.

Fitzgerald et al., "Interwoven Word Lines on RAM Chips," IBM Technical Disclosure Bulletin, vol. 27, No. 1B, Jun. 1984, New York, US, pp. 497–498.

*Primary Examiner*—David C. Nelms
*Assistant Examiner*—Michael T. Tran
*Attorney, Agent, or Firm*—Michele A. Mobley; Jenkens & Gilchrist

[57] ABSTRACT

The memory device in accordance with the present invention has hierarchical row decoding architecture and comprises at least one main decoder and a plurality of secondary decoders. The decoders have outputs coupled to a plurality of word lines respectively through a plurality of auxiliary lines having first ends respectively connected to said outputs and second ends respectively connected to intermediate points of the word lines.

33 Claims, 3 Drawing Sheets

HIERARCHIC MEMORY DEVICE HAVING AUXILIARY LINES CONNECTED TO WORD LINES

CROSS REFERENCE TO RELATED APPLICATION

This application claims priority from European application 95830405.7, filed Sep. 29, 1995, which is hereby incorporated by reference.

BACKGROUND AND SUMMARY OF THE INVENTION

The present invention relates to a hierarchical integrated circuit memory device.

The well known architecture of a generic memory device is shown schematically in the annexed FIG. 1. It includes a storage block MX made up of a plurality of memory cells arranged in a matrix organized in rows and columns, a row decoding block RD connected at input to three address lines B0,B1,B2, a column decoding block CD connected at input to three address lines B3,B4,B5, and a read/write (or read/write/erase) control block CNTR. The block MX is connected to the block RD through eight word-lines and to the block CD through eight bit-lines. This architecture is also described in U.S. Pat. No. 5,193,074, which is hereby incorporated by reference, at the block diagram level, the circuit level, the layout level, the silicon cross section level, and the operational level.

Semiconductor memory devices having architecture with hierarchical row decoding are known (e.g. from U.S. Pat. No. 5,193,074) at the block diagram and operational levels. The annexed FIG. 2 shows a block diagram of a simple hierarchical row decoding architecture which includes two storage sections SM each made up of a plurality of memory cells arranged in a matrix organized in rows and columns, two secondary row decoders SD and a main row decoder MD. In the diagram of FIG. 2 the decoder MD is connected at input to an address line B0 and is connected at output to two selection lines SL. The two decoders SD are connected at input both to the two lines SL and respectively to two address lines B1 and B2. The two decoders SD are also connected at output respectively to the two sections SM each through eight word lines WL.

There are well known reasons for using a hierarchical row decoding architecture (as illustrated in the above mentioned patent), including reduction of access time for equal storage capacity due to reduction of the word line length and hence resistance and reduction of the number of memory cells connected to each word line and hence their capacity.

The problem of reduction of word line resistance was solved in a technological manner, i.e. studying the manner and the material for making it on silicon. Normally, word lines are provided in polysilicon. A first solution for reducing the resistance is to superimpose on the polysilicon a layer of silicide. A second solution is to provide over the main word lines provided in polysilicon some auxiliary word lines provided in metallic material and to contact at regular intervals the main lines directly with the corresponding auxiliary lines.

These solutions are illustrated in U.S. Pat. No. 4,827,499, which is hereby incorporated by reference. In this patent there is also proposed a solution to the problem of compacting the word lines by arrangements such that the auxiliary lines would not extend for the entire length of the main lines and would not be adjacent thereto. In particular it is proposed to divide the word lines lengthwise in preferably eight sections so as to obtain uniform access time as well. But this takes place at the expense of a considerable increase in the length of the word lines since at the borders between each section and the adjacent one it is necessary to provide a space corresponding to two contacts plus the space between adjacent contacts to avoid short circuits between auxiliary word lines. In addition, the uniformity of access time is true only for cells connected to the same section and not for cells connected to different sections, especially if these sections are distant.

The purpose of the present invention is to further improve the memory devices having hierarchical row decoding architecture as concerns the duration and uniformity of access time.

This purpose is achieved, using the innovative teachings of the present application, through a memory device having hierarchical row decoding architecture and comprising at least one main decoder and a plurality of secondary decoders having outputs coupled to a plurality of word lines and characterized in that said outputs are coupled to said word lines respectively through a plurality of auxiliary lines having first ends respectively connected to said outputs and second ends respectively connected to intermediate points of said word lines. Further advantageous aspects of the present invention are set forth in the dependent claims.

By connecting the outputs of the secondary decoders, not to the end points of the word lines but to intermediate points and using auxiliary lines, access time uniformity, which is already good in the case of the hierarchical decoding, improves further.

In addition, if these auxiliary lines are provided in a low-resistivity material the access time is also reduced.

Lastly, if auxiliary lines connected to adjacent word lines are connected to adjacent secondary decoders the word lines can be compacted vertically.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 3:
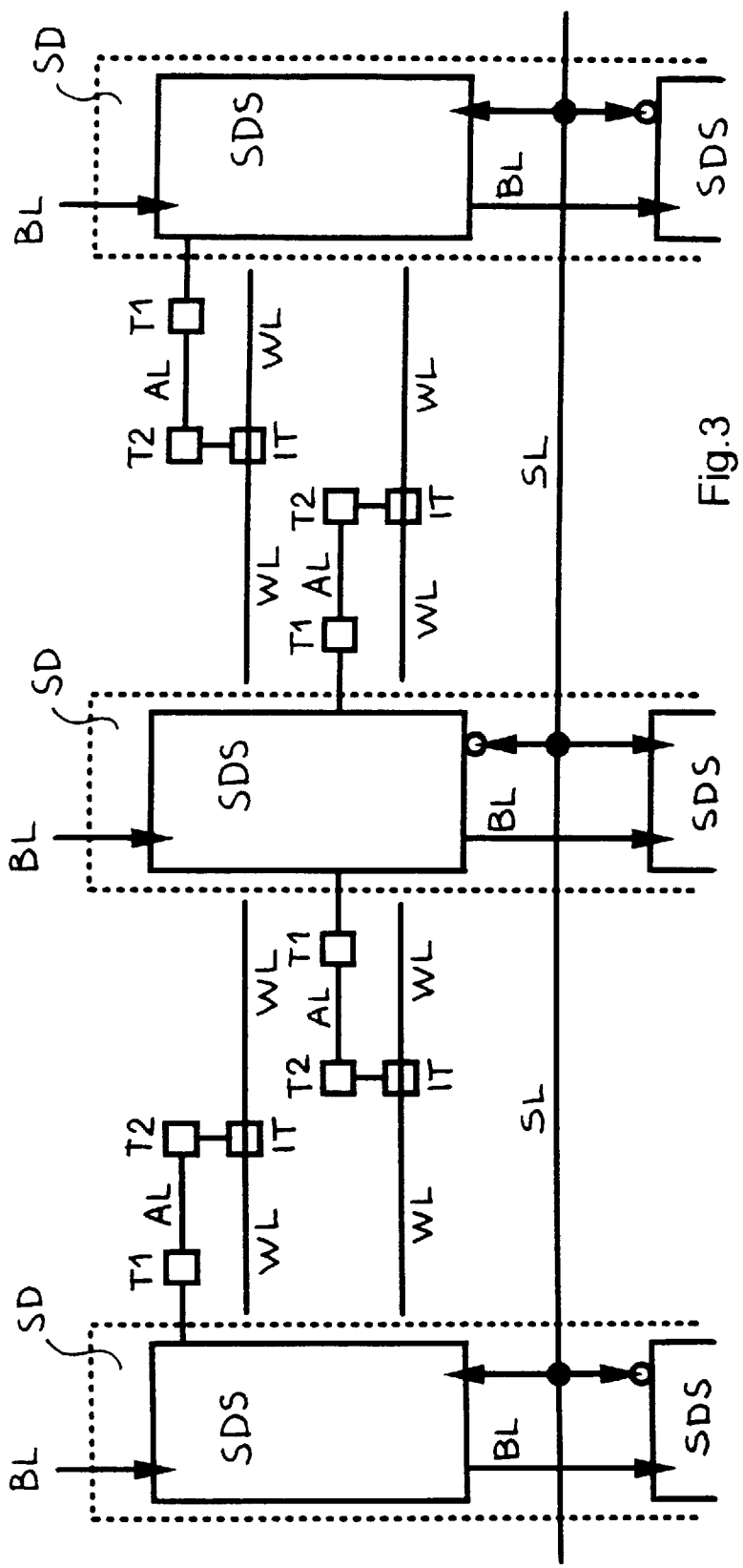
FIG. 3 shows diagrammatically part of a hierarchical row decoding architecture in accordance with the present invention.

The numerous innovative teachings of the present application will be described with particular reference to the presently preferred embodiment (by way of example, and not of limitation), in which:

In the block diagram of FIG. 3 there are three secondary decoders SD each divided in a certain number of decoding sections SDS of which only two are shown in the figure and in particular only one in detail. The complete decoding architecture corresponds to the replica of the diagram of FIG. 3 a certain number of times with the addition of a main decoder MD. More complicated decoding architectures can provide a much larger number of decoders SD, e.g. seventeen. The above mentioned U.S. Pat. No. 5,193,074 proposes hierarchical architectures with multiple levels all usable for implementation of the present invention.

Among the three decoders SD are placed two storage sections SM of which the figure show only the word lines WL to which are connected the memory cells.

In practical production on silicon of such an architecture a section SDS must be provided in the same vertical space in which are provided two memory cells with associated two lines WL. It is thus necessary to provide an adequate horizontal space. Each decoder SD is connected at input with at least one address line BL, typically different. The same line BL connects in the figure all the sections SDS of the decoder SD.

Each decoder SD is connected at input with at least one selection line SL, typical the same one. The same line SL connects in the figure six sections SDS of the three decoders SD. The logical signal present on the line SL is used in negated form or in normal form by the different sections SDS. This is indicated respectively as usual by the presence or absence of a small ball.

In FIG. 3 each section SDS has two outputs: one on the right side and one on the left side. The sections SDS belonging to decoders SD positioned near the edges of the architecture have a single output. In accordance with the present invention the outputs of the decoders SD are coupled to the word lines WL through a plurality of auxiliary lines AL having first ends T1 respectively connected to the outputs and second ends T2 respectively connected to the intermediate points IT of the word lines WL. In this manner the access time to the various cells is more uniform than if the outputs of the decoders SD were connected directly to end points of the word lines WL because the signal propagation time along the word lines WL is reduced. If the points IT corresponded to the mid-points of the word lines WL the propagation time would be virtually halved.

If the resistivity of the auxiliary lines AL is much lower than the resistivity of the word lines WL the propagation time of the signal along the lines AL is much less than the propagation time along the word lines WL and can be ignored in a first approximation. This means that the access time is reduced on the average.

One way of achieving this resistivity difference consists of providing the lines WL from a layer of polysilicon preferably overlain by a layer of silicide, and in providing the lines AL from a layer of metallic material. It can be foreseen that this layer of metallic material corresponds to the layer denominated 'metal2' since the layer denominated 'metal1' is used in general for provision of the bit lines.

As known, the design rules call for rather large distances between adjacent structures in metallic material, for example 1.3 micron, as compared to the distances between adjacent polysilicon structures, for example 0.6 micron. To obtain good compacting of the lines AL and hence of the lines WL it is appropriate that the auxiliary lines AL connected to the adjacent word lines WL be connected to different and in particular adjacent secondary decoders SD as shown in FIG. 3. This means that lines AL connected to adjacent lines WL are not adjacent as happens to the auxiliary lines A2 and A3 connected to the word lines W2 and W3 in FIG. 5.

Concerning the numerical examples mentioned above, the minimum width of a metallic material line is typically 1.1 micron while the minimum width of a polysilicon line is typically 0.6 micron.

Figure 5:
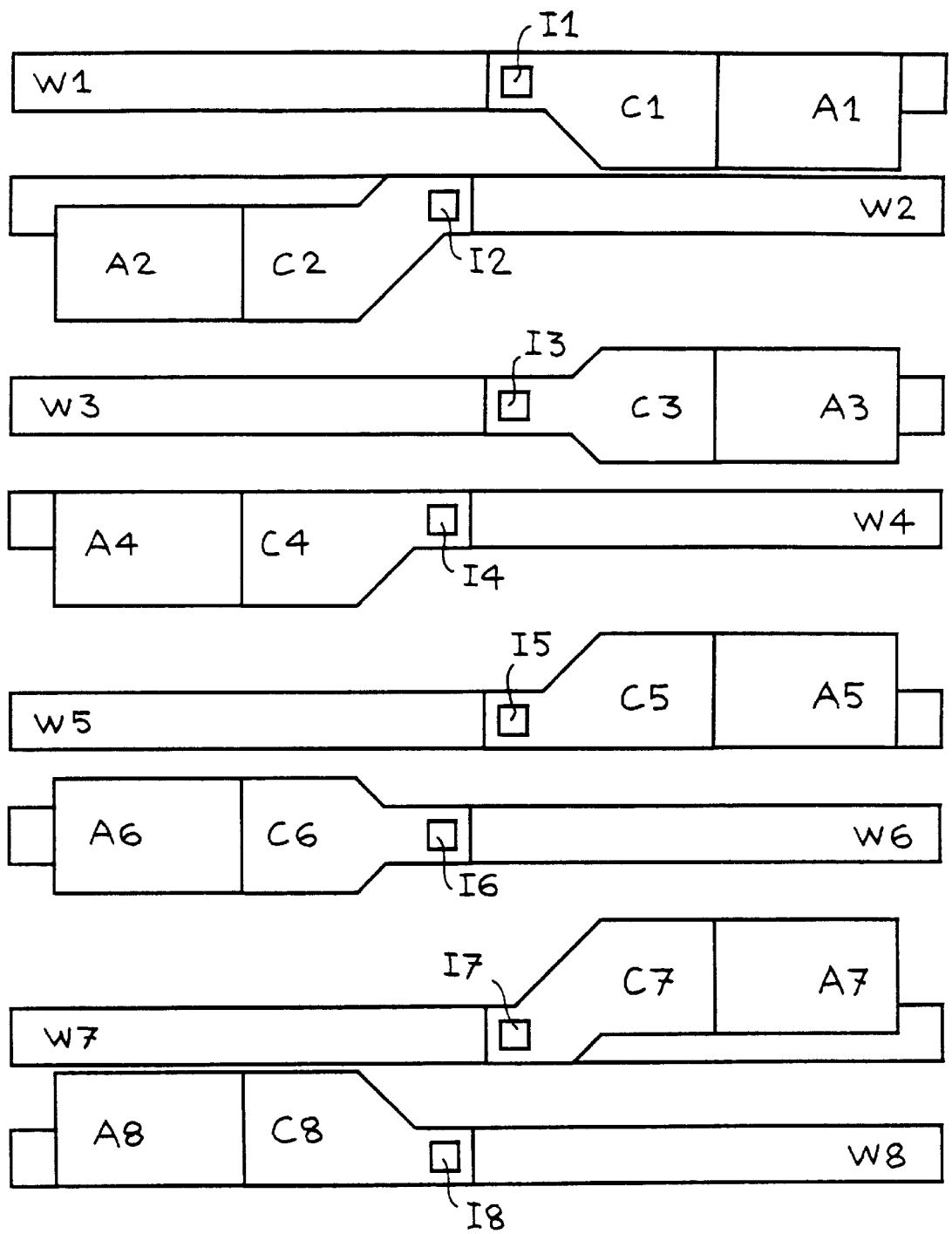
FIG. 5 shows in layout form a second detail of the architecture of FIG. 3.

The ideal positioning of all the intermediate points IT corresponds to the mid-point of the lines WL. In reality this is difficult to achieve because in practical production on silicon these points correspond to contacts which require rather extensive rectangular regions spaced mutually and which in general would lead to an excessive spacing of the lines WL. For this reason it is preferred to have the points IT staggered on adjacent lines WL with respect to the mid position as shown in FIG. 5 for the intermediate points I1, I2, I3, I4, I5, I6, I7, I8 respectively arranged on the lines W1, W2, W3, W4, W5, W6, W7, W8.

The greatest vertical compacting possible for the architecture is achieved when the auxiliary lines AL are arranged at constant distance apart corresponding to the smallest distance allowed by the design rules. In FIG. 5 this is true for the lines A1, A3, A5, A7 and the lines A2, A4, A6, A8. Naturally to achieve a smaller failure rate caused by short circuits it would be necessary to provide greater distance.

Figure 4:
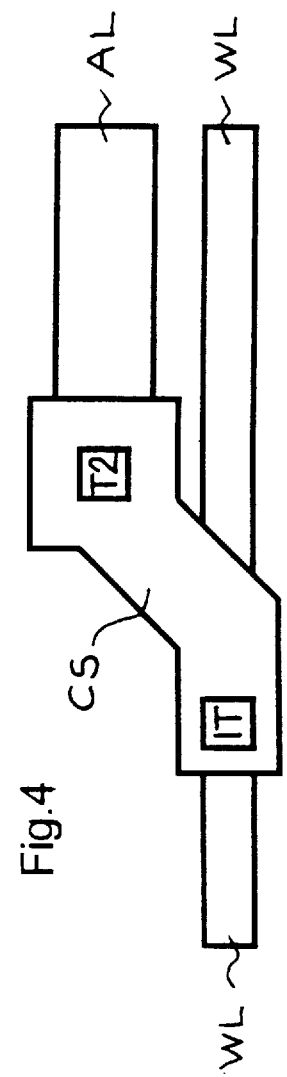
FIG. 4 shows in layout form a first detail of the architecture of FIG. 3.

If because of the types of layers used to provide the lines WL and the lines AL it is not possible technologically to contact them directly, the connections between the lines WL and the lines AL are provided by means of connection structures CS provided e.g. by a different layer of metallic material as shown in FIG. 4. This is the case already discussed in which the lines WL are in polysilicon and the lines AL are in 'metal2' and in which the structures CS are in metal1. The line WL will be contacted to the structure CS by means of a path at the end T2 and the structure CS will be contacted to the lines WL by means of a 'contact' at the point IT.

If the vertical positioning of the lines WL is chosen on the basis of the particular cell structure used while the vertical positioning of the lines AL is chosen, regardless of the former, on the basis of the structure of the decoders SD and on the basis of the desired distance between adjacent lines AL, the structures CS have a different form depending on the vertical alignment of the line WL and the line AL which they connect. This is the case for the connection structures C1, C2, C3, C4, C5, C6, C7, C8 in FIG. 5 with respect to the corresponding word lines W1, W2, W3, W4, W5, W6, W7, W8 and the corresponding auxiliary lines A1, A2, A3, A4, A5, A6, A7, A8.

FIG. 5 shows in simplified layout a central portion of a storage section SM in which are displayed among other things the contacts at the intermediate points I1, I2, I3, I4, I5, I6, I7, I8.

As may be inferred from FIG. 5, in the vertical space of two lines WL it is possible to house two lines AL and compact the lines WL at the limit of the minimum distance furnished for the polysilicon by the design rules, on condition of having cell and decoder architectures permitting it.

Accordingly the solution in accordance with the present invention exhibits the great advantage of not occupying any additional space with respect to a conventional hierarchical architecture but providing an access time virtually halved and with uniformity virtually halved with respect to thereto.

Figure 1:
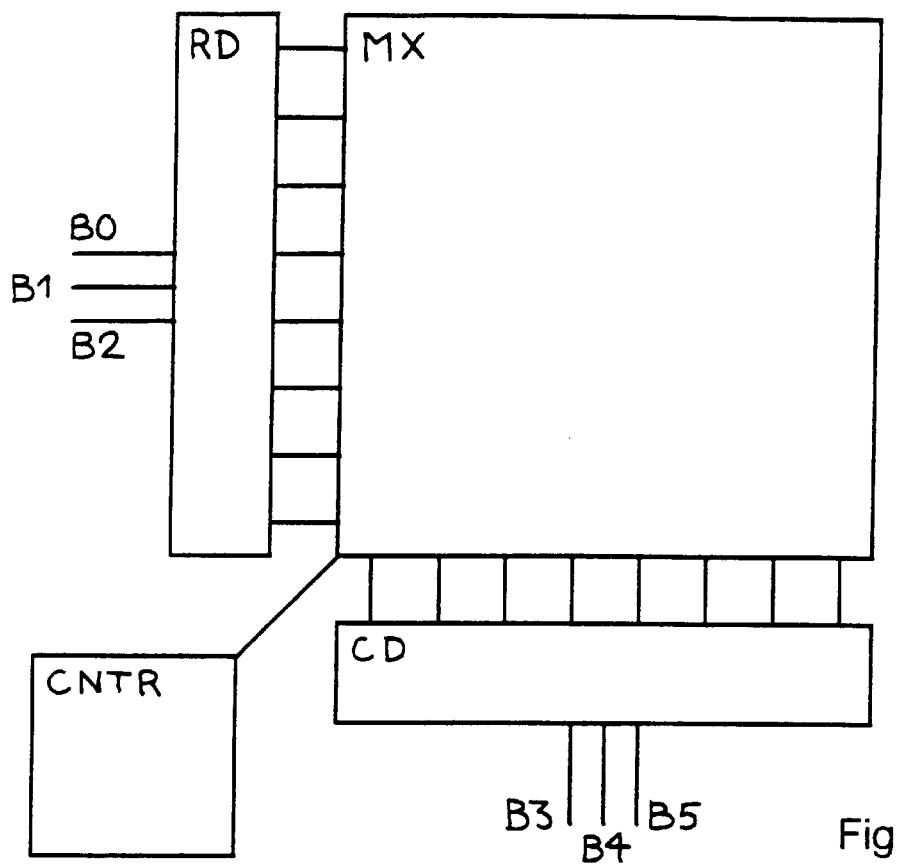
FIG. 1 shows a known architecture of a generic memory device in block diagram form.
Figure 2:
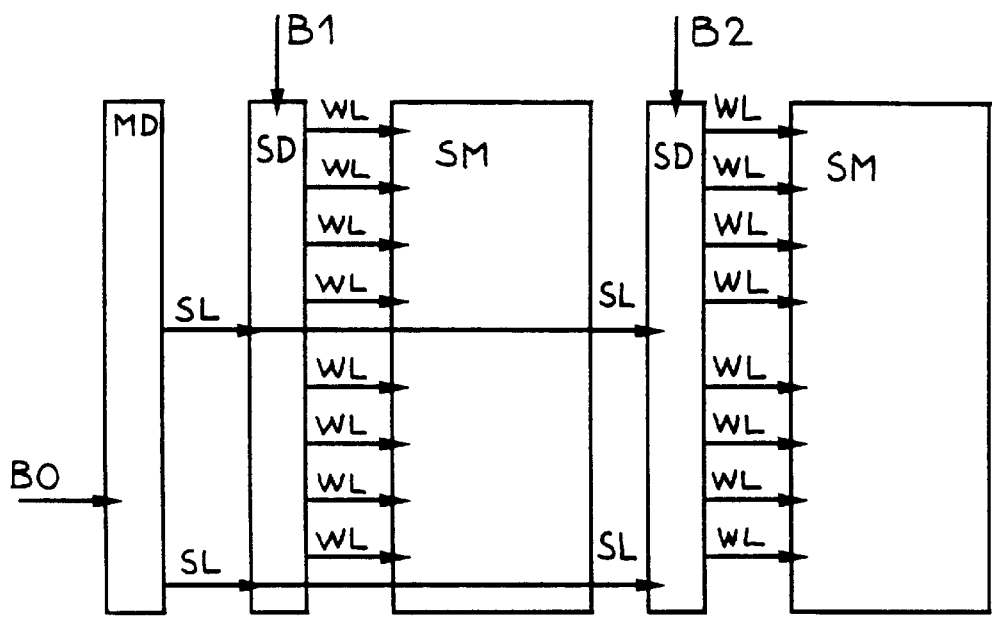
FIG. 2 shows a known hierarchical row decoding architecture in block diagram form.

A hierarchical row decoding architecture in accordance with the present invention can be used in a generic memory device such as that of FIG. 1.

Such a memory device can be provided in an integrated circuit alone or, together with other circuitry (such as for example a processor), as 'embedded' memory.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A memory device having hierarchical row decoding architecture the memory device comprising;

at least one main decoder and a plurality of secondary decoders having outputs coupled to a plurality of word lines, wherein said outputs are coupled to said word lines respectively through a plurality of auxiliary lines having first ends respectively connected to said outputs and second ends respectively connected to intermediate points of said word lines, and wherein the resistivity of said auxiliary lines is lower than the resistivity of said word lines, whereby the uniformity of access time is improved and the duration of access time is reduced.

2. The device in accordance with claim 1 wherein auxiliary lines connected to adjacent word lines are connected to different secondary decoders.

3. The device in accordance with claim 1 wherein said word lines are provided from a layer of polysilicon covered by a layer of silicide and wherein said auxiliary lines are provided from a layer of metallic material.

4. The device in accordance with claim 1 wherein auxiliary lines connected to adjacent word lines are not adjacent.

5. The device in accordance with claim 1 wherein intermediate points of adjacent word lines are not aligned and wherein each of said intermediate points are placed near the mid-points of said word lines.

6. The device in accordance with claim 1 wherein said auxiliary lines are arranged at a constant distance apart corresponding to the minimum distance allowed by the design rules.

7. The device in accordance with claim 2 further comprising connections configured to connect said word lines and said auxiliary lines, said connections including connection structures having a different layer of metallic material.

8. The device in accordance with claim 7 wherein the construction of said structures depend on the vertical alignment of the word line and auxiliary line which they connect.

9. An integrated circuit comprising:

a hierarchical memory device having at least one main decoder; and a plurality of secondary decoders including outputs coupled to a plurality of auxiliary lines and a plurality of word lines having intermediate points, one of said outputs being coupled to one of said word lines respectively through one of said plurality of auxiliary lines having first end respectively connected to said one of said outputs and a second end respectively connected to the respective intermediate point of said one of said word lines;

wherein the resistivity of said auxiliary lines is lower than the resistivity of said word lines;

whereby the uniformity of access time is improved and the duration of access time is reduced.

10. The integrated circuit of claim 9, wherein said intermediate points correspond to a mid-point of said respective one of said word lines.

11. The integrated circuit of claim 9, wherein said auxiliary lines connected to respective adjacent ones of said word lines are connected to respective adjacent ones of said secondary decoders.

12. The integrated circuit of claim 9, wherein said intermediate points are staggered on adjacent ones of said word lines.

13. The integrated circuit of claim 9, wherein said auxiliary lines are arranged at a constant distance, wherein said word lines are compacted to the minimum distance between adjacent ones of said word lines.

14. The integrated circuit of claim 9, wherein said second ends of said auxiliary lines are connected to said respective ones of said word lines through connection structures.

15. The integrated circuit of claim 14, wherein said auxiliary lines comprise a first type of metallic material and said connection structures comprise a second type of metallic material.

16. A memory device, comprising:

a main decoder having an output connected to a selection line;

a plurality of secondary decoders, each of said secondary decoders having an inputs connected to said selection line and to an address line;

a plurality of word lines corresponding to a plurality of auxiliary lines, each of said word lines being coupled, at an intermediate point thereof, to an output of a respective one of said secondary decoders through a respective one of said auxiliary lines; and wherein the resistivity of said auxiliary lines is lower than the resistivity of said word lines whereby the uniformity of access time is improved and the duration of access time is reduced.

17. The device of claim 16, wherein a hierarchical row decoding architecture is used.

18. The device of claim 16, wherein said word lines comprise polysilicon.

19. The device of claim 16, wherein said auxiliary lines comprise metallic material.

20. The device of claim 16, wherein said intermediate point corresponds to a mid-point of said word lines.

21. The device of claim 16, wherein respective ones of said intermediate points are staggered on adjacent ones of said word lines.

22. The device of claim 16, wherein each of said auxiliary lines is connected to an adjacent one of said word lines and to an adjacent one of said secondary decoders.

23. The device of claim 16, wherein said auxiliary lines are arranged at a constant distance, wherein said word lines are compacted to the minimum distance between adjacent ones of said word lines.

24. The device of claim 16, wherein said auxiliary lines are connected to respective ones of said word lines through connection structures.

25. The device of claim 24, wherein said auxiliary lines comprise a first type of metallic material and said connection structures comprise a second type of metallic material.

26. A hierarchical memory device, comprising:

at least one main decoder having an output connected to a selection line;

a plurality of secondary decoders, each of said secondary decoders having inputs connected to said selection line and to an address line;

a plurality of word lines corresponding to a plurality of auxiliary lines, each of said word lines being coupled, at an intermediate point, to an output of a respective one of said secondary decoders through a respective one of said auxiliary lines;

wherein each of said auxiliary lines is connected to a respective one of said word lines through a connection structure; and wherein the resistivity of said auxiliary lines is lower than the resistivity of said word lines whereby the uniformity of access time is improved and the duration of access time is reduced.

27. The device of claim 26, wherein said word lines comprise polysilicon.

28. The device of claim 26, wherein said auxiliary lines comprise metallic material.

29. The device of claim 26, wherein said intermediate points correspond to a mid-point of said word lines.

30. The device of claim 26, wherein said intermediate points are staggered on adjacent ones of said word lines.

31. The device of claim 26, wherein each of said auxiliary lines is connected to an adjacent one of said word lines and to an adjacent ones of said secondary decoders.

32. The device of claim 26, wherein said auxiliary lines are arranged at a constant distance, wherein said word lines are compacted to the minimum distance between adjacent ones of said word lines.

33. The device of claim 29, wherein said auxiliary lines comprise a first type of metallic material and said connection structures comprise a second type of metallic material.

* * * * *